US009208844B1

(12) United States Patent
Lamb et al.

(10) Patent No.: US 9,208,844 B1
(45) Date of Patent: Dec. 8, 2015

(54) DDR RETIMING CIRCUIT

(71) Applicant: Netronome Systems, Inc., Santa Clara, CA (US)

(72) Inventors: Joseph M. Lamb, Hopkinton, MA (US); Chunli Cai, Fremont, CA (US); Ranjit D. Loboprabhu, Shrewsbury, MA (US)

(73) Assignee: Netronome Systems, Inc., Santa Clara, CA (US)

( * ) Notice: Subject to any disclaimer, the term of this patent is extended or adjusted under 35 U.S.C. 154(b) by 0 days.

(21) Appl. No.: 14/448,841

(22) Filed: Jul. 31, 2014

(51) Int. Cl.
*H03K 19/00* (2006.01)
*G11C 8/18* (2006.01)
*G11C 8/06* (2006.01)

(52) U.S. Cl.
CPC ... *G11C 8/18* (2013.01); *G11C 8/06* (2013.01)

(58) Field of Classification Search
USPC ............................................. 326/28, 96, 29
See application file for complete search history.

(56) References Cited

U.S. PATENT DOCUMENTS 6,239,611 B1 * 5/2001 Matera ............................ 326/16
6,798,241 B1 * 9/2004 Bauer et al. ..................... 326/40

* cited by examiner

*Primary Examiner* — Vu Le
(74) *Attorney, Agent, or Firm* — Imperium Patent Works LLP; T. Lester Wallace; Mark D. Marrello

(57) ABSTRACT

An integrated circuit receives a DDR (Double Data Rate) data signal and an associated DDR clock signal, and communicates those signals from integrated circuit input terminals a substantial distance across the integrated circuit to a subcircuit that then receives and uses the DDR data. Within the integrated circuit, a DDR retiming circuit receives the DDR data signal and the associated DDR clock signal from the terminals. The DDR retiming circuit splits the DDR data signal into two components, and then transmits those two components over the substantial distance toward the subcircuit. The subcircuit then recombines the two components back into a single DDR data signal and supplies the DDR data signal and the DDR clock signal to the subcircuit. The DDR data signal and the DDR clock signal are supplied to the subcircuit in such a way that setup and hold time requirements of the subcircuit are met.

20 Claims, 2 Drawing Sheets

DDR RETIMING CIRCUIT

INTERLAKEN DDR COMMUNICATION
BETWEEN INTEGRATED CIRCUITS

DDR RETIMING CIRCUIT

TIMING DIAGRAM

DDR RETIMING CIRCUIT

TECHNICAL FIELD

The described embodiments relate generally to circuits and methods for receiving Double Data Rate (DDR) signals.

BACKGROUND INFORMATION

Double Data Rate (DDR) signals may be received onto an integrated circuit via integrated circuit terminals. In the case of the Interlaken signaling protocol, these DDR signals may include a DDR data signal, a DDR sync signal, and an associated DDR clock signal. Within the integrated circuit, a subcircuit is to receive and use these DDR signals. The subcircuit is, however, located a substantial distance away from the terminals and there are substantial signal propagation delays between the terminals and corresponding inputs to the subcircuit. If the DDR signals are to pass across this substantial distance from the terminals to the subcircuit inputs, then it may be difficult or cumbersome to maintain the necessary timing relationships between the DDR data, DDR sync and DDR clock signals such that the subcircuit will properly receive the DDR data without incurring setup time and/or hold time violations. To prevent such setup and/or hold time violations, the data, sync and clock signal conductors between the integrated circuit terminals and the subcircuit must generally be carefully laid out to have adequately matched propagation delays.

SUMMARY

An integrated circuit includes a DDR data terminal and an associated DDR clock terminal. A DDR data signal is received onto the integrated circuit via the DDR data terminal and a DDR clock signal is received onto the integrated circuit via the DDR clock terminal. DDR data received across the DDR data terminal is to be used by a subcircuit located a substantial distance from the terminals. A novel DDR retiming circuit captures the DDR data signal from the DDR data terminal, splits it into two components, communicates the two components toward the subcircuit over the substantial distance, and then recombines the two components back into a single DDR data signal for use by the subcircuit. The DDR retiming circuit then supplies the single DDR data signal and the DDR clock signal to the subcircuit with suitable timing such that setup and hold time requirements of the input circuitry of the subcircuit are met.

The DDR retiming circuit includes four sequential logic elements (SLEs), a first data signal path, a second data signal path, a multiplexer, a delay buffer, and DDR Clock Signal Supplying Circuit (DCSSC). A DDR data signal is received onto the integrated circuit via a first input terminal and passes through a first input buffer to a data input lead of the first SLE. The data input lead of the first SLE is directly coupled to a data input lead of the second SLE, so the incoming DDR data signal is also received onto the data input lead of the second SLE. The DCSSC supplies the DDR clock signal to the first and second SLEs such that the first SLE is clocked on rising edges of the DDR clock signal and such that the second SLE is clocked on falling edges of the DDR clock signal. A data input lead of the third SLE is coupled to a data output lead of the first SLE via the first data signal path. A data input lead of the fourth SLE is coupled to a data output lead of the second SLE via the second data signal path. The DCSSC circuitry supplies the DDR clock signal to the third and fourth SLEs such that the third SLE is clocked on falling edges of the DDR clock signal and such that the fourth SLE is clocked on rising edges of the DDR clock signal. A first data input lead of the multiplexer is coupled to a data output lead of the third SLE and a second data input lead of the multiplexer is coupled to a data output lead of the fourth SLE. A select input lead of the multiplexer is coupled to the DCSSC circuitry such that during one half of a cycle of the DDR clock signal the signal on the first data input lead of the multiplexer is supplied onto the data output lead of the multiplexer, and such that during the other half of the cycle of the DDR clock signal the signal on the second data input lead of the multiplexer is supplied onto the data output lead of the multiplexer. The DCSSC circuitry supplies the DDR clock signal to a DDR clock signal input lead of the subcircuit. A DDR data signal present on the data output lead of the multiplexer is supplied via the delay buffer to a DDR data input lead of the subcircuit.

In one example, the DCSSC circuitry is a length of a conductor that includes a first portion, a second portion, and a third portion. The DDR clock signal propagates from the DDR clock terminal of the integrated circuit, through an input buffer, through the first portion of the DCSSC circuitry, through the second portion of the DCSSC circuitry, through the third portion of the DCSSC circuitry, and to the select input lead of the multiplexer. The second portion of the DCSSC circuitry, the first data signal path, and the second data signal path are all made to be substantially coequal lengths of conductive interconnect. Signal propagation delays through each of these lengths of conductive interconnect is, in one example, at least ten times the clock-to-data output propagation delay through the sequential logic elements.

In a method of operation, a DDR data signal is received onto an integrated circuit via one or more terminals and an input buffer and is then clocked into a first flip-flop and a second flip-flop, where the first flip-flop is clocked on rising edges of a DDR clock signal and where the second flip-flop is clocked on falling edges of the DDR clock signal. Each of the two signal outputs of the first and second flip-flops is communicated a substantial distance across the integrated circuit via a different length of a conductor. Likewise, the DDR clock signal is communicated a substantial distance across the integrated circuit through a length of a conductor. At a location close to a subcircuit, the signal output of the first flip-flop is clocked into a third flip-flop, and the signal output of the second flip-flop is clocked into a fourth flip-flop. The third flip-flop is clocked on falling edges of the DDR clock signal whereas the fourth flip-flop is clocked on rising edges of the DDR clock signal. The signal outputs of the third and fourth flip-flops are multiplexed by a two-to-one multiplexer, thereby regenerating a DDR data signal on the multiplexer data output lead. At the same approximate time that the signal on the select input of the multiplexer is changed, the data value output by one of the third and fourth flip-flops also changes. The multiplexer is controlled to switch to (so that it then selects) the data value that is changing. The resulting regenerated DDR data signal as output onto the multiplexer output lead is then delayed by a delay buffer. The delayed version of the regenerated DDR data signal is then supplied to a DDR data input lead of the subcircuit. The DDR clock signal is supplied onto a DDR clock input lead of the subcircuit.

In the method, the DDR clock signal is received onto the integrated circuit via one or more terminals, and passes through an input buffer, and then passes through a DDR Clock Signal Supplying Circuit (DCSSC). In one example, the DCSSC is a length of a conductor that includes a first portion, a second portion, and a third portion. The DDR clock signal on the first portion is supplied directly onto the clock input of the first flip-flop, and is inverted and then supplied in inverted fashion onto the clock input of the second flip-flop. The DDR clock signal on the third portion is supplied directly onto the clock input of the fourth flip-flop, and is inverted and supplied in inverted fashion onto the clock input of the third flip-flop. The clock signal on the third portion is also supplied directly onto the select input lead of the multiplexer. The second portion is a length of conductor that extends the substantial distance, and that separates the first portion and the second portion. In other examples of the method of operation, differential signaling is employed in the DCSSC and some or all of the digital logic elements involved in the method are differential digital logic elements.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to background examples and some embodiments of the invention, examples of which are illustrated in the accompanying drawings.

Figure 1:
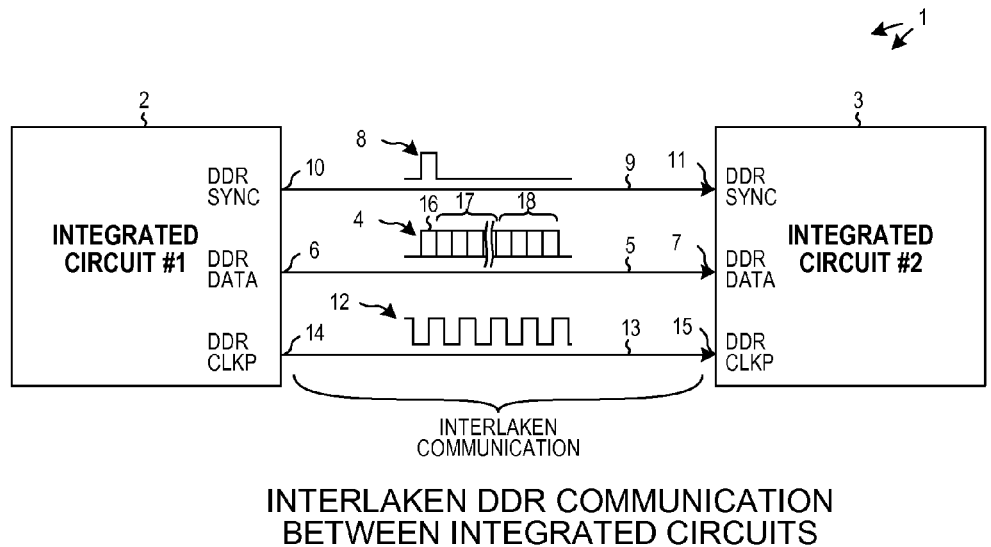
FIG. 1 is a diagram of a system 1 that employs a novel DDR retiming circuit.

FIG. 1 is a circuit diagram of a system 1 involving a first integrated circuit 2 and a second integrated circuit 3. A Double Data Rate (DDR) data signal 4 is communicated across conductor 5 from a DDR data terminal 6 of the first integrated circuit 2 to a DDR data terminal 7 of the second integrated circuit 3. A DDR sync signal 8 is communicated across conductor 9 from a DDR sync terminal 10 of the first integrated circuit 2 to a DDR sync terminal 11 of the second integrated circuit 3. A DDR clock signal 12 is communicated across conductor 13 from a DDR clock terminal 14 of the first integrated circuit 2 to a DDR clock terminal 15 of the second integrated circuit 3. In one example, the signals 4, 8 and 12 are communicated in accordance with out-of-band flow control specifications of the Interlaken protocol, revision 1.2. If one of sixty-four Interlaken communication channels is overloaded, then the first integrated circuit 2 sends a multi-bit communication across the data conductor 5 to the second integrated circuit 3. The multi-bit communication involves a start bit 16, sixty-four channel status bits 17, and four CRC check bits 18. Each bit of the sixty-four channel status bits 17 indicates whether the second integrated circuit 3 is to stop sending data across a corresponding one of the sixty-four channels to the first integrated circuit 2. The channels (not shown) extend from the second integrated circuit 3 to the first integrated circuit. In accordance with the Interlaken standard, the DDR sync bit indicates the beginning of the flow control calendar, and is therefore asserted on conductor 9 during the time the start bit 16 is sent across the data conductor 5. The DDR clock signal 12 is a 100 MHz 50/50 square wave clock signal that transitions in the middle of each bit communicated across the data conductor 5.

Figure 2:
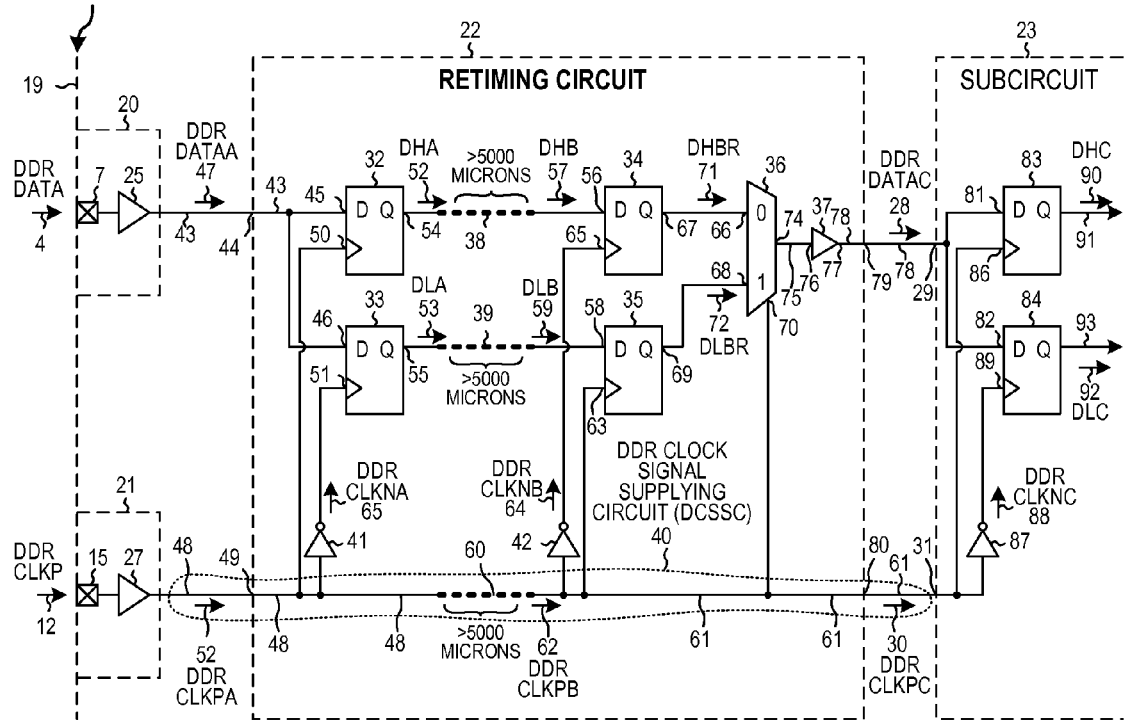
FIG. 2 is a circuit diagram of one particular implementation of the novel DDR retiming circuit.

FIG. 2 is a more detailed diagram of circuitry in the second integrated circuit 3. Dashed line 19 indicates the boundary of the second integrated circuit 3. The second integrated circuit 3 includes a first input/output (I/O) block 20, a second I/O block 21, a novel DDR retiming circuit 22, and a subcircuit 23. The colloquial term "I/O block" is used here in customary fashion to describe circuitry blocks 20 and 21 even though these blocks may not involve circuitry for driving signals out of the second integrated circuit 3. Such an I/O block is typically disposed around the periphery a rectangular integrated circuit and includes buffer circuitry and (ElectroStatic Discharge) ESD protection circuitry. The subcircuit 23 is to receive DDR data received onto the second integrated circuit 3 via DDR data terminal 7. In the one particular example described here, the data to be received by the subcircuit 23 is the multi-bit out-of-band flow control communication described above. Although not illustrated in the simplified diagram of FIG. 2, the subcircuit 23 also receives the DDR sync signal and processes it in the same way that it processes the DDR data signal.

I/O block 20 includes a DDR data terminal 7 and an input buffer 25. I/O block 21 includes a DDR clock terminal 15 and an input buffer 27. Each of the terminals 7 and 15 is, in one example, a semiconductor package terminal and an associated integrated circuit bond pad along with an electrical connection between the two.

Although single-ended I/O blocks are illustrated in the specific embodiment of FIG. 2, in another embodiment each of the I/O blocks receives a differential signal and therefore includes an additional input terminal. The input buffer of such an I/O block has two differential input signal inputs, one for each input terminal.

In the specific example of FIG. 2, subcircuit 23 receives a DDR data signal DDR DATAC 28 from the DDR retiming circuit 22 onto data input lead 29. Subcircuit 23 also receives a DDR clock signal DDR CLKPC 30 from the DDR retiming circuit 22 onto clock input lead 31. Although not shown in FIG. 2, the subcircuit 23 also receives a DDR sync signal from the DDR retiming circuit 22.

In the specific example of FIG. 2, DDR retiming circuit 22 includes a first Sequential Logic Element (SLE) 32, a second SLE 33, a third SLE 34, a fourth SLE 35, a multiplexer 36, a delay buffer 37, a first data signal path 38, a second data signal path 39, a DDR Clock Signal Supplying Circuit (DCSSC) 40, a first inverter 41, and a second inverter 42. In this example, the sequential logic elements are all identical flip-flops. The DDR data signal 4 is received on the terminal 7, and passes through input buffer 25, and propagates across conductor 43 to the data input data input lead 44 of the DDR retiming circuit 22, further along conductor 43 to the data input lead 45 first SLE 32. The data input lead 45 of the first SLE 32 is coupled to the data input lead 46 of the second SLE 33 so the DDR data signal is also received onto the data input lead 46 of the second SLE 33. A different signal name DDR DATAA 47 is used to indicate the DDR data signal on the conductor 43. The DDR clock signal DDR CLKP 12 is received on the terminal 15, and passes through input buffer 27, and propagates across a first portion 48 of the DCSSC 40, to the clock input lead 49 of the DDR retiming circuit, and onward to the clock input lead 50 of the first SLE 32. The DDR clock signal on the first portion 48 is inverted by inverter 41, thereby generating signal DDR CLKNA 65. DDR CLKNA 65 is supplied onto the clock input lead 51 of the second SLE 33. Due to the way the first and second SLEs 32 and 33 are coupled to the DCSSC 40, the first SLE 32 is clocked on rising edges of the clock signal and the second SLE 33 is clocked on falling edges of the clock signal. A different signal name DDR CLKPA 52 is used to indicate the version of the DDR clock signal that is present on the first portion 48 of the DCSSC. The first and second SLEs split the DDR data signal into two components, denoted here as signal DHA 52 and signal DLA 53. Signal DHA 52 is output onto the data output lead 54 of the first SLE 32. Signal DLA 53 is output onto the data output lead 55 of the second SLE 33.

The data input lead 56 of the third SLE 34 is coupled via the first data signal path 38 to the data output lead 54 of the first SLE 32. It takes a substantial signal propagation delay time for the DHA signal to propagate through the first data signal path 38 to the data input lead 56 of the third SLE 34, so another signal name DHB 57 is used to denote the signal present on the data input lead 56 of the third SLE 34. Likewise, the data input lead 58 of the fourth SLE 35 is coupled via the second data signal path 39 to the data output lead 55 of the second SLE 33. It takes substantial signal propagation delay time for the DLA signal to propagate through the second data signal path 39 to the data input lead 58 of the fourth SLE 35, so another signal name DLB 59 is used to denote the signal present on the data input lead 58 of the fourth SLE 35.

The DCSSC 40 includes the first portion 48, a second portion 60, and a third portion 61. In the present example, the DCSSC 40 is a length of conductive interconnect and includes no digital logic elements. The DDR clock signal propagates from the first portion 48, across the second portion 60, to the third portion 61, and through the third portion 61 to the DDR clock output 80 of the DDR retiming circuit 22, and further through the third portion 61 to the DDR clock input lead 31 of the subcircuit 23. Because it takes a substantial amount of time for the DDR clock signal to propagate through the second portion 60 another signal name DDR CLKPB 62 is used to denote the signal present on the third portion 61 of the DCSSC. The clock input lead 63 of the fourth SLE 35 receives the DDR CLKPB signal 62 from the third portion 61 of the DCSSC. Inverter 42 inverts the clock signal DDR CLKPB, thereby generating signal DDR CLKNB 64 that is supplied onto the clock input lead 65 of the third SLE 34.

Due to the way the third and fourth SLEs 34 and 35 are coupled to the DCSSC 40, the third SLE 34 is clocked on falling edges of the DDR clock signal and the fourth SLE 35 is clocked on rising edges of the DDR clock signal. The data signal DHA output by the first SLE 32 transitions shortly after rising edges of the DDR clock signal whereas the third SLE 34 is clocked on falling edges of the DDR clock signal, so there is about a half clock period of setup time and about a half clock period of hold time for the third SLE 34 to latch in data. Likewise, the data signal DLA output by the second SLE 33 transitions shortly after falling edges of the DDR clock signal whereas the fourth SLE 34 is clocked on rising edges of the DDR clock signal, so there is about a half clock period of setup time and about a half clock period of hold time for the fourth SLE 35 to latch in data.

The signal DHBR 71 passes from the data output lead 67 of the third SLE 34 and to the first data input lead 66 of multiplexer 36. The signal DLBR 72 passes from the data output lead 69 of the fourth SLE 35 to the second data input lead 68 of multiplexer 36. The select input lead 70 of multiplexer 36 is coupled to the third portion 61 of the DCSSC 40. One the two SLEs 34 and 35 is clocked at about the time when the multiplexer 36 is switched. The multiplexer 36 to controlled to switch to select the signal that is changing. The third and fourth SLEs 34 and 35 and the multiplexer 36 operate together to combine the two component signals DHB and DLB into the DDR data signal DDR DATAC 28. The signal DDR DATAC 28 passes from the data output lead 74 of multiplexer 36, across conductor 75 to the input lead 76 of delay buffer 37, through delay buffer 37, from the output lead 77 of buffer 37, across conductor 78 to the data output lead 79 of the DDR retiming circuit 22.

The DDR DATAC signal 28 is received onto the input lead 29 of the subcircuit 23, and is supplied onto the data input leads 81 and 82 of the sequential logic elements 83 and 84, respectively. The DDR CLKPC signal 30 is supplied in non-inverted fashion onto the clock input lead 86 of SLE 83. The signal DDR CLKPC 30 is inverted by inverter 87, thereby generating signal DDR CLKNC 88. DDR CLKNC 88 is supplied onto the clock input lead 89 of SLE 84. SLE 83 is clocked on rising edges of the DDR clock signal whereas SLE 84 is clocked on falling edges of the DDR clock signal. SLE 83 outputs the signal DHC 90 onto conductor 91. SLE 84 outputs the signal DLC 92 onto conductor 93. Components 83, 84 and 87 together are the DDR input circuitry of the subcircuit 23.

In the present example, the unloaded clock-to-data output propagation delays through each of the SLEs 32-35, 83 and 84 is about fifty picoseconds. The setup time requirement of these SLEs is about sixty picoseconds. The hold time requirement of these SLEs is about ten picoseconds. The amount of time required for a signal to propagate all the way through the first data signal path 38, or the second data signal path 39, or the second portion 60 of the DCSSC is at least ten times the unloaded clock-to-data output delay time of the SLEs. The propagation signal delays through the first data signal path 38, the second data signal path 39, and the second portion 60 are only roughly equal and in one specific example are each about three nanoseconds. The SLEs 32-35, 83 and 84 are rising edge triggered flip-flops. The two-to-one multiplexer 36 is controlled to switch (change which of its two data input leads is coupled to its multiplexer data output lead) every half cycle of the DDR CLKPB signal, and one the SLEs 83 and 84 is clocked roughly at each half cycle time, but the data buffer 37 is made to have a substantial propagation delay so that this propagation delay will ensure that the DDR DATAC signal 28 being clocked into the SLEs 83 and 84 will have adequate hold time on the data input lead of the SLE being clocked. In one specific example, the propagation delay of delay buffer 37 is made to be at least twice the maximum hold time of an SLE, or about twenty picoseconds. Due to operation of the DDR retiming circuit 22, setup time and hold time requirements of SLEs 83 and SLE 84 are not violated even though the propagation delays through paths 38, 39 and 60 are substantial and vary from each other. Each of the conductors 38, 39 and 60 in one specific example is about 10,000 microns long (>5000 microns long), and is driven by a weak buffer, and is implemented in a 22 nm semiconductor fabrication process. Whereas conventionally without the use of the novel DDR retiming circuit it was sometimes difficult to match (over process, voltage, and temperature) signal propagation delays of data and clock signals from package terminals to the remotely located subcircuits that used the DDR signals such that setup time and hold time requirements of the input circuitry of the subcircuits were met, with the novel DDR retiming circuit 22 of FIG. 2 the task of matching the propagation delays through paths 38, 39 and 60 is comparatively relaxed.

Figure 3:
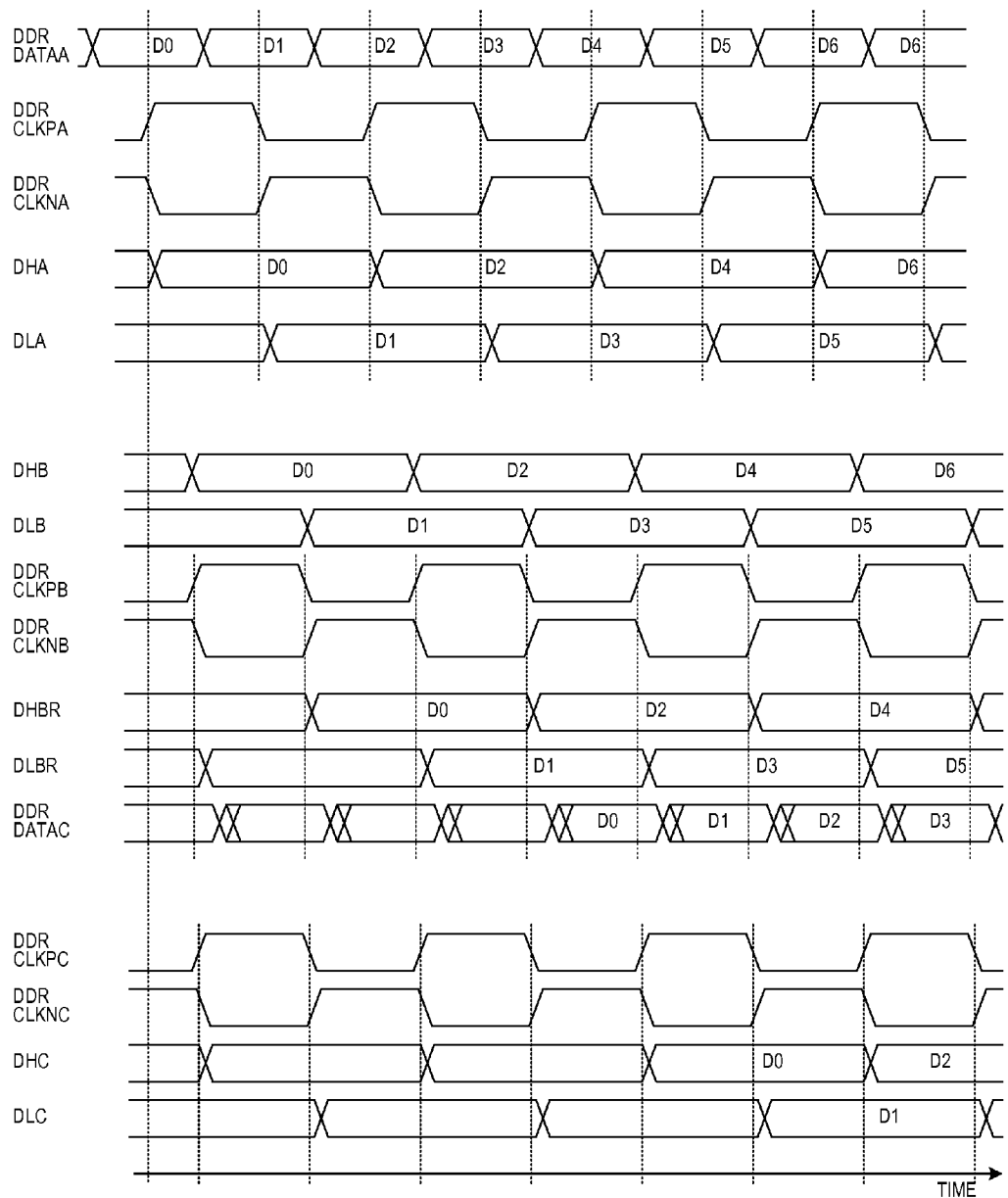
FIG. 3 is a simplified illustrative timing diagram for the novel DDR retiming circuit 22 of FIG. 2.

FIG. 3 is a simplified illustrative timing diagram for the novel DDR retiming circuit 22 of FIG. 2.

Although certain specific embodiments are described above for instructional purposes, the teachings of this patent document have general applicability and are not limited to the specific embodiments described above. A specific example of the DDR retiming circuit is described above in connection with a particular type of DDR signaling (Interlaken protocol version 1.2 out-of-band flow control DDR signaling), but the DDR retiming circuit is not limited to use in Interlaken protocol compliant communication systems. Rather, the DDR retiming circuit sees general applicability in receiving and retiming other types of DDR signals. Although a specific example of the DDR retiming circuit is described above that is comprised of single-ended CMOS logic, the DDR retiming circuit can be realized using another type of digital logic including logic that employs differential signaling. Depending on the embodiment, either none or some or all of the circuitry of the DDR retiming circuit can be realized using other types of logic including a type of logic that uses differential signaling. For example, the input buffers 25 and 27 may be LVDS (low-voltage differential signaling) buffers, each of the I/O blocks 20 and 21 may involve two terminals and an input buffer that receives differential signals from those two terminals, the sequential logic elements of the DDR retiming circuit may receive both positive and negative clock signals from the DCSSC 40, and the DCSSC 40 may involve pairs of clock signal lines that carry differential clock signals and that supply the differential clock signals to the SLEs. The DDR retiming may be employed in a full custom ASIC (Application Specific Integrated Circuit), or may be realized as part of a programmed FPGA (Field Programmable Gate Array) or similar programmable logic device. Rather than the DCSSC being a single length of a conductor as in the embodiment of FIG. 2, the DCSSC in other embodiments can include a Phase-Locked Loop (PLL) or other circuit that is usable to supply various delayed and inverted versions of a DDR clock signal that are needed to clock the first, second, third and fourth SLEs with suitable timing. In an FPGA implementation, the first and second SLEs may be manually placed close to the receiving terminals whereas the third and fourth SLEs the multiplexer and delay buffer may be manually placed close to the subcircuit. Accordingly, various modifications, adaptations, and combinations of various features of the described embodiments can be practiced without departing from the scope of the invention as set forth in the claims.

What is claimed is:

1. An integrated circuit comprising:
a first input terminal that receives a double date rate (DDR) data signal onto the integrated circuit;
a first input buffer;
a second input terminal that receives a DDR clock signal onto the integrated circuit;
a second input buffer;
a first sequential logic element (SLE) having a data input lead and a data output lead, wherein the DDR data signal passes from the first input terminal, through the first input buffer, and to the data input lead of the first SLE;
a second SLE having a data input lead and a data output lead, wherein the DDR data signal passes from the first input terminal, through the second input buffer, and to the data input lead of the second SLE;
a first data signal path;
a second data signal path;
a third SLE having a data input lead and a data output lead, wherein the data input lead of the third SLE is coupled via the first data signal path to the data output lead of the first SLE;
a fourth SLE having a data input lead and a data output lead, wherein the data input lead of the fourth SLE is coupled via the second data signal path to the data output lead of the second SLE;
a multiplexer having first data input lead, a second data input lead, a select input lead, and a data output lead, wherein the first data input lead of the multiplexer is coupled to the data output lead of the third SLE, wherein the second data input lead of the multiplexer is coupled to the data output lead of the fourth SLE; and
a DDR Clock Signal Supplying Circuit (DCSSC) having a first portion, a second portion, and a third portion, wherein the DDR clock signal passes from the second input terminal, through the second input buffer, through the first portion of the DCSSC, through the second portion of the DCSSC, and through the third portion of the DCSSC to the select input lead of the multiplexer, wherein clock input leads of the first and second SLEs are coupled to the first portion of the DCSSC such that the first SLE is clocked on rising edges of the DDR clock signal and the second SLE is clocked on falling edges of the DDR clock signal, and wherein clock input leads of the third and fourth SLEs are coupled to the third portion of the DCSSC such that the third SLE is clocked on falling edges of the DDR clock signal and the fourth SLE is clocked on rising edges of the DDR clock signal.

2. The integrated circuit of claim 1, wherein the first data signal path is an amount of conductive interconnect that extends from the data output lead of the first SLE to the data input lead of the third SLE, wherein the first data signal path includes no digital logic element, wherein the first SLE has a clock-to-data out propagation delay PD1, wherein a signal propagating from the data output lead of the first SLE to the data input lead of the third SLE via the first data signal path has a propagation delay PD2, and wherein PD2 is at least ten times PD1.

3. The integrated circuit of claim 2, wherein the DDR clock signal has a third propagation delay PD3 when it passes through the second portion of the DCSSC, and wherein PD3 is at least ten times PD1.

4. The integrated circuit of claim 1, wherein the first portion of the DCSSC is an amount of conductive interconnect and includes no digital logic element, wherein the second portion of the DCSSC is an amount of conductive interconnect and includes no digital logic element, and wherein the third portion of the DCSSC is an amount of conductive interconnect and includes no digital logic element.

5. The integrated circuit of claim 1, further comprising:
a buffer having a data input lead and a data output lead, wherein the data input lead of the buffer is coupled to the data output lead of the multiplexer.

6. The integrated circuit of claim 5, wherein the first SLE has a hold time requirement, and wherein a propagation delay through the buffer is greater than the hold time requirement of the first SLE.

7. The integrated circuit of claim 1, wherein the first and fourth SLEs are positive edge triggered sequential logic elements, and wherein the second and third SLEs are negative edge triggered sequential logic elements.

8. The integrated circuit of claim 1, wherein the first, second, third and fourth SLEs are all positive edge triggered sequential logic elements, wherein the DCSSC supplies a non-inverted version of the DDR clock signal onto the clock input lead of the first SLE and supplies an inverted version of the DDR clock signal onto the clock input lead of the second SLE, and wherein the DCSSC supplies a non-inverted version of the DDR clock signal onto the clock input lead of the fourth SLE and supplies an inverted version of the DDR clock signal onto the clock input lead of the third SLE.

9. The integrated circuit of claim 1, wherein the first portion of the DCSSC is directly coupled to the clock input lead of the first SLE, wherein the first portion of the DCSSC is coupled to the clock input lead of the second SLE via a first inverter, wherein the third portion of the DCSSC is directly coupled to the clock input lead of the fourth SLE, and wherein the third portion of the DCSSC is coupled to the clock input lead of the third SLE via a second inverter.

10. The integrated circuit of claim 1, wherein the DDR data signal as it is received onto the integrated circuit is a differential signal, wherein the first input terminal is one of two input terminals that receive the differential DDR data signal onto the integrated circuit, wherein the DDR clock signal as it is received onto the integrated circuit is a differential signal, and wherein the second input terminal is one of two input terminals that receive the differential DDR clock signal onto the integrated circuit.

11. An integrated circuit comprising:
a first sequential logic element (SLE) having a data input lead and a data output lead;
a second SLE having a data input lead and a data output lead, wherein the data input lead of the first SLE is coupled to the data input lead of the second SLE;
a first data signal path;
a second data signal path;
a third SLE having a data input lead and a data output lead, wherein the data input lead of the third SLE is coupled via the first data signal path to the data output lead of the first SLE;
a fourth SLE having a data input lead and a data output lead, wherein the data input lead of the fourth SLE is coupled via the second data signal path to the data output lead of the second SLE;
a multiplexer having first data input lead, a second data input lead, a select input lead, and a data output lead, wherein the first data input lead of the multiplexer is coupled to the data output lead of the third SLE, wherein the second data input lead of the multiplexer is coupled to the data output lead of the fourth SLE; and
means for conducting a clock signal such that the first and fourth SLEs are clocked on rising edges of the clock signal and such that the second and third SLEs are clocked on falling edges of the clock signal.

12. The integrated circuit of claim 11, wherein the first data signal path is an amount of conductive interconnect that extends from the data output lead of the first SLE to the data input lead of the third SLE, wherein the first data signal path includes no digital logic element, wherein the first SLE has a clock-to-data out propagation delay PD1, wherein a signal propagating from the data output lead of the first SLE to the data input lead of the third SLE via the first data signal path has a propagation delay PD2, and wherein PD2 is at least ten times PD1.

13. The integrated circuit of claim 12, wherein the means for conducting comprises a first portion, a second portion, and a third portion, and wherein the means conducts the clock signal such that the clock signal propagates from the first portion, through the second portion, and to the third portion, wherein the clock signal propagates through the second portion of the means with a propagation delay PD3, and wherein PD3 is at least ten times PD1.

14. The integrated circuit of claim 11, wherein the means for conducting includes a first portion, a second portion, and a third portion, wherein the first portion of the means is directly coupled to a clock input lead of the first SLE, wherein the first portion of the means is coupled to a clock input lead of the second SLE via a first inverter, wherein the third portion of the means is directly coupled to a clock input lead of the fourth SLE, and wherein the third portion of the means is coupled to a clock input lead of the third SLE via a second inverter.

15. The integrated circuit of claim 11, wherein the means for conducting includes no digital logic element.

16. The integrated circuit of claim 11, wherein the means for conducting includes at least one digital logic element.

17. The integrated circuit of claim 11, wherein the first data signal path is a first amount of conductive interconnect that extends from the data output lead of the first SLE to the data input lead of the third SLE, wherein the second data signal path is a second amount of conductive interconnect that extends from the data output lead of the second SLE to the data input lead of the fourth SLE, wherein the means comprises a first portion, a second portion, and a third portion, and wherein the second portion of the means is a third amount of conductive interconnect that extends from the first portion of the means to the second portion of the means.

18. The integrated circuit of claim 17, wherein each of the first, second and third amounts of conductive interconnect extends for a distance of at least five thousand microns.

19. The integrated circuit of claim 17, wherein the means is for conducting the clock signal from a terminal of the integrated circuit, through a buffer, through the first portion of the means, through the second portion of the means, and through the third portion of the means, and to the select input lead of the multiplexer.

20. The integrated circuit of claim 17, wherein the clock signal is a double date rate (DDR) clock signal, and wherein a DDR data signal is received onto the data input leads of the first and second SLEs.

\* \* \* \* \*